US008378346B2

(12) United States Patent
Pagani

(10) Patent No.: US 8,378,346 B2
(45) Date of Patent: Feb. 19, 2013

(54) CIRCUIT ARCHITECTURE FOR THE PARALLEL SUPPLYING DURING ELECTRIC OR ELECTROMAGNETIC TESTING OF A PLURALITY OF ELECTRONIC DEVICES INTEGRATED ON A SEMICONDUCTOR WAFER

(75) Inventor: Alberto Pagani, Nova Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/022,419

(22) Filed: Feb. 7, 2011

(65) Prior Publication Data

US 2011/0186838 A1   Aug. 4, 2011

Related U.S. Application Data

(63) Continuation-in-part of application No. PCT/EP2009/005655, filed on Aug. 5, 2009.

(30) Foreign Application Priority Data

Aug. 7, 2008  (IT) .............................. MI2008A1492

(51) Int. Cl.
*H01L 23/58* (2006.01)
(52) U.S. Cl. ............. 257/48; 257/E21.531; 257/E23.01; 438/17
(58) Field of Classification Search .................... 257/48, 257/202, 203, 207, 208, 210, 211, 620, E23.01, 257/E21.531; 438/17, 14, 18; 324/252, 260, 324/537, 750.1–762.06
See application file for complete search history.

(56) References Cited

U.S. PATENT DOCUMENTS

| | | | | |
|---|---|---|---|---|
| 5,059,899 | A | * | 10/1991 | Farnworth et al. ............... 438/18 |
| 5,366,906 | A | * | 11/1994 | Wojnarowski et al. .......... 438/17 |
| 5,489,538 | A | * | 2/1996 | Rostoker et al. ................ 438/15 |
| 5,532,174 | A | | 7/1996 | Corrigan |
| 5,654,588 | A | * | 8/1997 | Dasse et al. .................... 257/754 |
| 5,696,404 | A | * | 12/1997 | Murari et al. ................. 257/620 |
| 5,897,193 | A | * | 4/1999 | Nishino ........................ 257/691 |
| 5,923,047 | A | * | 7/1999 | Chia et al. ....................... 257/48 |

(Continued)

FOREIGN PATENT DOCUMENTS

| | | |
|---|---|---|
| EP | 0 413 542 A2 | 2/1991 |
| EP | 0 913 863 A2 | 5/1999 |

(Continued)

OTHER PUBLICATIONS

Machine translation, Nakamura, Japanese Patent Publication H07-297244.*

(Continued)

*Primary Examiner* — Fernando L Toledo
*Assistant Examiner* — Victoria K Hall
(74) *Attorney, Agent, or Firm* — Seed IP Law Group PLLC

(57) ABSTRACT

A circuit architecture provides for the parallel supplying of power during electric or electromagnetic testing of electronic devices integrated on a same semiconductor wafer and bounded by scribe lines. The circuit architecture comprises a conductive grid interconnecting the electronic devices and having a portion external to the devices and a portion internal to the devices. The external portion extends along the scribe lines; and the internal portion extends within at least a part of the devices. The circuit architecture includes interconnection pads between the external portion and the internal portion of the conductive grid and provided on at least a part of the devices, the interconnection pads forming, along with the internal and external portions, power supply lines which are common to different electronic devices of the group.

19 Claims, 17 Drawing Sheets

U.S. PATENT DOCUMENTS

| | | | |
|---|---|---|---|
| 5,956,567 A | 9/1999 | Tomita | |
| 5,969,538 A * | 10/1999 | Whetsel | 324/750.3 |
| 6,341,070 B1 * | 1/2002 | Yu | 361/760 |
| 6,730,989 B1 * | 5/2004 | Reithinger et al. | 257/620 |
| 6,744,067 B1 * | 6/2004 | Farnworth et al. | 257/48 |
| 6,806,494 B2 * | 10/2004 | Fenner et al. | 257/48 |
| 6,806,556 B2 * | 10/2004 | Ohara | 257/620 |
| 6,844,631 B2 | 1/2005 | Yong et al. | |
| 6,861,761 B2 | 3/2005 | Yang et al. | |
| 7,071,487 B2 * | 7/2006 | Maruyama | 257/48 |
| 7,202,682 B2 | 4/2007 | Cooper et al. | |
| 7,642,551 B2 * | 1/2010 | Maruyama | 257/48 |
| 2003/0067001 A1 | 4/2003 | Poo et al. | |
| 2003/0141529 A1 | 7/2003 | Seto et al. | |
| 2005/0167831 A1 | 8/2005 | Tsubosaki | |
| 2006/0163700 A1 | 7/2006 | Bae | |
| 2006/0236172 A1 * | 10/2006 | Okamoto | 714/724 |
| 2007/0200585 A1 * | 8/2007 | Takeuchi et al. | 324/763 |
| 2007/0216438 A1 | 9/2007 | Gupta et al. | |
| 2007/0275539 A1 * | 11/2007 | Rashid et al. | 438/460 |
| 2008/0173999 A1 | 7/2008 | Chung et al. | |
| 2008/0277705 A1 | 11/2008 | Takahashi et al. | |
| 2009/0102065 A1 | 4/2009 | Lee | |
| 2009/0212399 A1 * | 8/2009 | Kaneda et al. | 257/620 |
| 2011/0049728 A1 * | 3/2011 | Pagani | 257/773 |

FOREIGN PATENT DOCUMENTS

| | | | |
|---|---|---|---|
| JP | H02-144931 | * | 6/1990 |
| JP | H02-211648 | * | 8/1990 |
| JP | H06-151535 | * | 5/1994 |
| JP | H07-297244 | * | 11/1995 |
| JP | 2000-124278 | * | 4/2000 |
| JP | 2004-342725 | * | 12/2004 |
| WO | WO 2007/036867 | * | 4/2007 |
| WO | 2010/015388 A1 | | 2/2010 |

OTHER PUBLICATIONS

Machine translation, Aizawa, Japanese Patent Publication H06-151535.*

Machine translation, O, Japanese Patent Publication JP 2000-124278.*

Machine translation, Enohara, Japanese Patent Publication JP 2004-342725.*

Derwent summary for Shiraiwa, JP H02-211648.*

Derwent summary for Kawaguchi, JP H02-144931.*

Ivy, W. L. et al., "Sacrificial Metal Wafer Level Burn-in KGD," Proceedings of the Electronic Components and Technology Conference, Las Vegas, NV., pp. 535-540, 2000.

Sauter, W. et al., "Problems with Wirebonding on Probe Marks and Possible Solutions," Proceedings of the 53rd Electronic Components and Technology Conference, pp. 1350-1358, May 27-30, 2003.

Yong, L. et al., "Novel Method of Separating Probe and Wire Bond Regions Without Increasing Die Size," Proceedings of the 53rd Electronic Components and Technology Conference, pp. 1323-1329, May 27-30, 2003.

Williams, B. et al., "A 44μm Probe Process Characterization and Factory Deployment Using Probe-Over Passivation," SWTW-2003, Motorola, Inc., 2002.

* cited by examiner

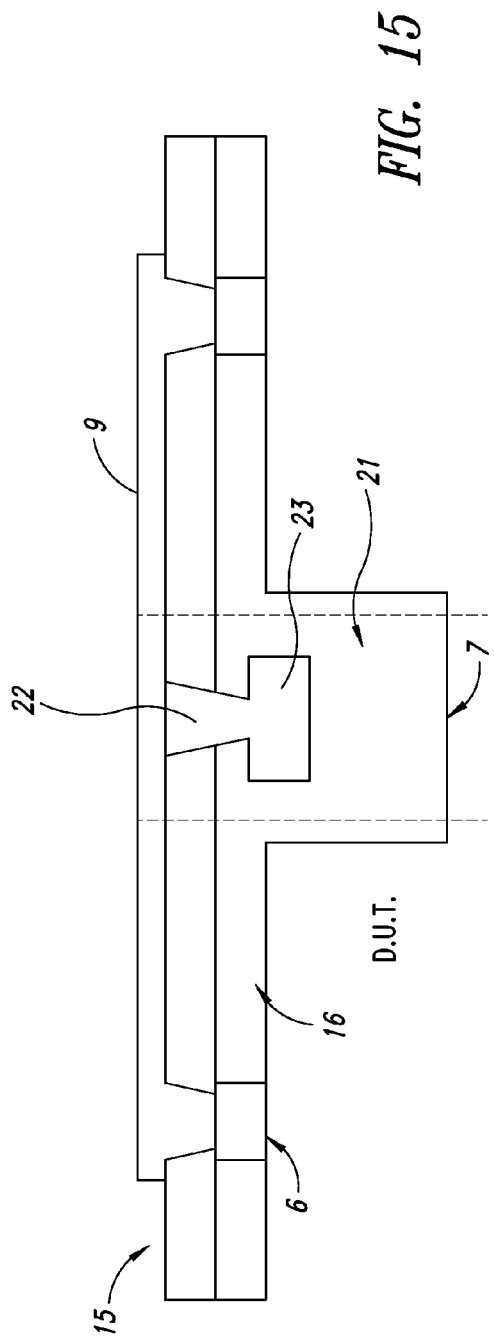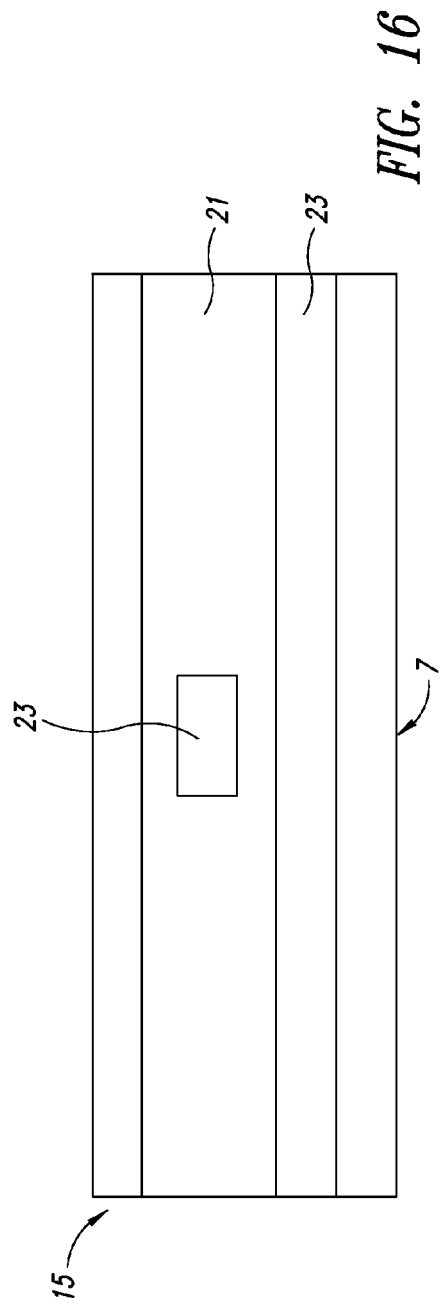

CIRCUIT ARCHITECTURE FOR THE PARALLEL SUPPLYING DURING ELECTRIC OR ELECTROMAGNETIC TESTING OF A PLURALITY OF ELECTRONIC DEVICES INTEGRATED ON A SEMICONDUCTOR WAFER

BACKGROUND

1. Technical Field

The present disclosure relates to a circuit architecture and a method for solving the problem of the parallel supplying during the testing steps, in particular electromagnetic wafer sort (EMWS) testing, of a plurality of electronic devices integrated on a semiconductor wafer and arranged in parallel on said wafer.

The disclosure further relates to creating connections between the various devices on the wafer, for then using them during the testing of the wafer itself to supply them, due to the non-negligible power required by the operation of the devices themselves.

The disclosure particularly, but not exclusively, relates to applications of a process of electric wafer sort (EWS) and/or electromagnetic wafer sort (EMWS) and/or wafer level burn-in (WLBI) intended for the quality control in the manufacturing of electronic devices integrated on semiconductor wafer.

2. Description of the Related Art

As it is well known in this specific technical field, an electric selection of electronic devices integrated on a semiconductor wafer (testing EWS) is carried out by electrically connecting a testing apparatus, i.e. a tester which carries out the measurements, to a wafer whereon components, devices or electronic circuits have been realized according to known processes of semiconductor monolithic integration.

To realize this connection between the testing apparatus and the wafer an interface is provided known as "probe card". This interface is substantially an electronic board substantially constituted by a printed circuit board (PCB) and by some hundreds (sometimes thousands) of probes which electrically connect the tester to ends known as pads of the integrated electronic devices to be tested.

A known type of electric testing on wafer is WLBI (Wafer Level Burn-In) and is used to check the reliability of a device by using test conditions at particularly high activation energies (in relation to the specific device and to the technology used for realizing it) to accelerate the failure mechanisms.

One of the several known solutions of WLBI testing has been developed in Motorola and is described in an article:

Electronic Components and Technology Conference 2000-Sacrificial Metal Wafer Level Burn-In KGD-Wilburn L. Ivy Jr., Prasad Godavarti, Nouri Alizy, Teresa Mckenzie, Doug Mitchell-Motorola Incorporated.

This article takes into consideration the creation of metallic connections on the wafer which connect to each other groups of electronic devices in a clusters architecture.

These metallic connections, that could be also considered as grids, are realized outside the various devices by overlapping, at the end of the manufacturing step, strips of sacrificial metal thereon. These strips are removed and completely eliminated by means of an acid etching at the end of the WLBI testing operations, to allow to carry out an electric testing on each single electronic device.

Some studies are currently ongoing to carry out a testing of the electromagnetic type (and at the most wireless), even during the step of manufacturing the devices so as to avoid, as much as possible (and at the most to completely avoid) the use of the probes of the testing apparatus. These studies are focused towards carrying out a parallel testing onto a plurality of devices or onto a whole wafer.

In fact, although advantageous under several aspects, and substantially meeting the aim, the probes which connect the tester to the wafer have some drawbacks; for example, they can lead to a damaging of the pads of the electronic devices selected for the testing. This damaging can cause problems in the assembly of the electronic devices that have passed the quality control at the end of the testing.

Moreover, for the electric or electromagnetic selection of said plurality of electronic devices, carried out in parallel, probe cards with a very high number of probes are used. This implies an increase of the contacting problems, and thus an increase of the electric continuity problems between the probe card and the wafer, or, better, between the probes and the pads of the electronic device, with subsequent problems of loss of electric performance.

Other problems are due to the mechanical limits of last generation state-of-the-art electronic devices, which have a high number of pads to be contacted, or have pads of reduced area, or even pads which are often very close to each other.

In case it is possible, in the future, to pass from completely electric testing mode to electromagnetic (completely or in part) testing mode, the introduction in each device of reception and transmission circuits is provided, so called transceivers or transponders. This will imply an increase of area of each electronic device, even if this need is to be considered unavoidable.

By using an electromagnetic testing the number of probes of the current testing apparatuses will be reduced or even eliminated.

However, the parallel electric or electromagnetic testing of a plurality of devices arranged on a single wafer, raises the problem of how to supply them enough to operate under testing conditions.

Obviously, when the testing parallelism increases, in consequence the power that the electromagnetic testing will have to use for the simultaneous supply of the various devices will increase.

In substance, the problem of supplying the various electronic devices which are tested in parallel is tied to the fact that these devices should operate simultaneously during the testing.

BRIEF SUMMARY

Some embodiments of the present disclosure provide a circuit architecture, and a corresponding method, to supply in parallel a plurality of electronically devices monolithically integrated on a single semiconductor wafer and intended to be tested in parallel, i.e. when all the devices operate simultaneously and the power they use can also be relatively high.

One embodiment of the present disclosure realizes electric connections between various electronic devices integrated on the wafer so as to create common power supply lines (and possibly also signal lines) which, if brought to a suitable biasing voltage, allow the devices to operate simultaneously.

One embodiment realizes electric connections between the various electronic devices on the wafer which can be used as common power supply lines but avoiding to impact as much as possible on the project or on the design of the electronic devices. These common power supply lines can be realized by means of some conductive grids realized in the so called "scribe line" of the wafer, i.e. in the separation area which separates a device from the other.

The creation of these common power supply lines (and possibly signal lines) may add one or more diffusion masks with respect to those already provided in the manufacturing process of the electronic devices.

To supply the common power supply lines, one can exploit physical connections, between the power supply and the wafer itself.

All the electronic devices realized on a same wafer can have common connections, or be assembled with each other in groups with common connections only at the dice of the same group, or there can also be a mixed situation.

One embodiment is a circuit architecture for the parallel supplying of power during an electric or electromagnetic testing of a plurality of electronic devices each integrated on a same semiconductor wafer wherein said electronic devices are neatly provided on said semiconductor wafer through integration techniques and have edges bounded by separation scribe lines. The circuit architecture comprises:

at least one conductive grid, interconnecting at least one group of said electronic devices and having a portion being external to the devices of said group and a portion being internal to the devices of said group;

the external portion of said conductive grid being extended also along said separation scribe lines;

the internal portion being extended within at least a part of the devices of said group;

interconnection pads between said external portion and said internal portion of said conductive grid being provided on at least a part of the devices of said group, said interconnection pads forming, along with said internal and external portions, power supply lines which are common to different electronic devices of said group.

Advantageously, each electronic device of said at least one group thus comprises at least one additional power supply pad (and/or possibly signal pad) in correspondence with at least one edge of the electronic device for the connection with the external portion of said conductive grid.

Moreover, the use is provided of a plurality of additional power supply pads (and/or possibly signal pads), at least one at each edge of the electronic devices of said at least one group.

A noteworthy fact is that the above external portion is a bridging electric connection between at least one couple of pads of adjacent electronic devices; while the internal portion is an electric connection between at least two pads of a same electronic device.

In particular, according to an aspect of the disclosure, each electronic device of said at least one group comprises at least a power supply pad at the edge of the electronic device for the connection with the external portion of said conductive grid.

According to another aspect of the disclosure, a plurality of said power supply pads may be provided, at least one at each edge of the electronic devices of said at least one group.

Moreover, according to yet another aspect of the disclosure, said external portion may be an electronic bridging connection between at least one couple of power supply pads of adjacent electronic devices.

Also, according to another aspect of the disclosure, said internal portion may be an electric connection between two interconnection and power supply pads of a same electronic device.

According to an aspect of the disclosure, said internal portion may be formed by a Crossing technique.

Moreover, according to an aspect of the disclosure, said external portion may be formed by a Bridging technique.

According to another aspect of the disclosure, at least one part of said external portion may be realized in the scribe lines region separating an electronic device to another.

Moreover, according to an aspect of the disclosure, the circuit architecture further includes an insulating layer positioned on one of said scribe lines. The external portion includes at least one metal layer deposited on said at least one insulating layer which extends between two adjacent interconnection pads of two adjacent electronic devices.

According to another aspect of the disclosure, said part of said external portion in the scribe lines region comprises at least one metal layer deposited on a layer of filling insulating material extending within said scribe lines, at least partially filling said scribe lines.

Furthermore, according to yet another aspect of the disclosure, said interconnection pads may comprise power supply dummy pads and signal dummy pads.

According to another aspect of the disclosure, said external portion and said internal portion of said conductive grid may be orthogonal to each other.

Moreover, according to an aspect of the disclosure, at least one of said external portion and said internal portion of said conductive grid may be realized by a conductive line which is buried in at least one of said electronic devices or of said semiconductor wafer.

According to another aspect of the disclosure, said external portion and said internal portion of said conductive grid may be insulated from each other at crossover points.

In particular, at least one via connection may be provided to contact said buried conductive line.

Advantageously according to another aspect of the disclosure, the circuit architecture further comprises at least one fuse link connected to at least one conductive grid.

Moreover, the circuit architecture may further comprise at least one fuse link included into said at least one conductive grid.

One embodiment is a method comprising the steps of:

forming scribe lines on a semiconductor wafer;

forming a plurality of electronic devices integrated on said semiconductor wafer separated from each other by said scribe lines;

forming a respective plurality of interconnection pads on each electronic device respectively;

forming a conductive grid on said semiconductor wafer, said step of forming said conductive grid including the steps of:

forming an external portion of said conductive grid along said scribe lines;

forming an internal portion of said conductive grid within said electronic devices; and connecting an interconnection pad of each electronic device to an interconnection pad of a respective adjacent electronic device and to said conductive grid to form power supply lines common to said electronic devices.

According to an aspect of the disclosure, said step of forming said internal portion may comprise electrically connecting two interconnection pads of a same electronic device.

Moreover, according to another aspect of the disclosure, the method further comprises a step of supplying a voltage to all of said electronic devices simultaneously through said conductive grid.

Finally, the method may comprise a step of simultaneously testing of said electronic devices.

The characteristics and the advantages of the circuit architecture and of the method according to the present disclosure will be apparent from the following description of an embodiment thereof given by way of indicative and non-limiting example with reference to the annexed drawings.

BRIEF DESCRIPTION OF THE SEVERAL VIEWS OF THE DRAWINGS

FIGS. 15 and 16 show an enlarged vertical section schematic view of a circuit architecture portion on the semiconductor wafer of FIG. 14;

DETAILED DESCRIPTION

Figure 1:
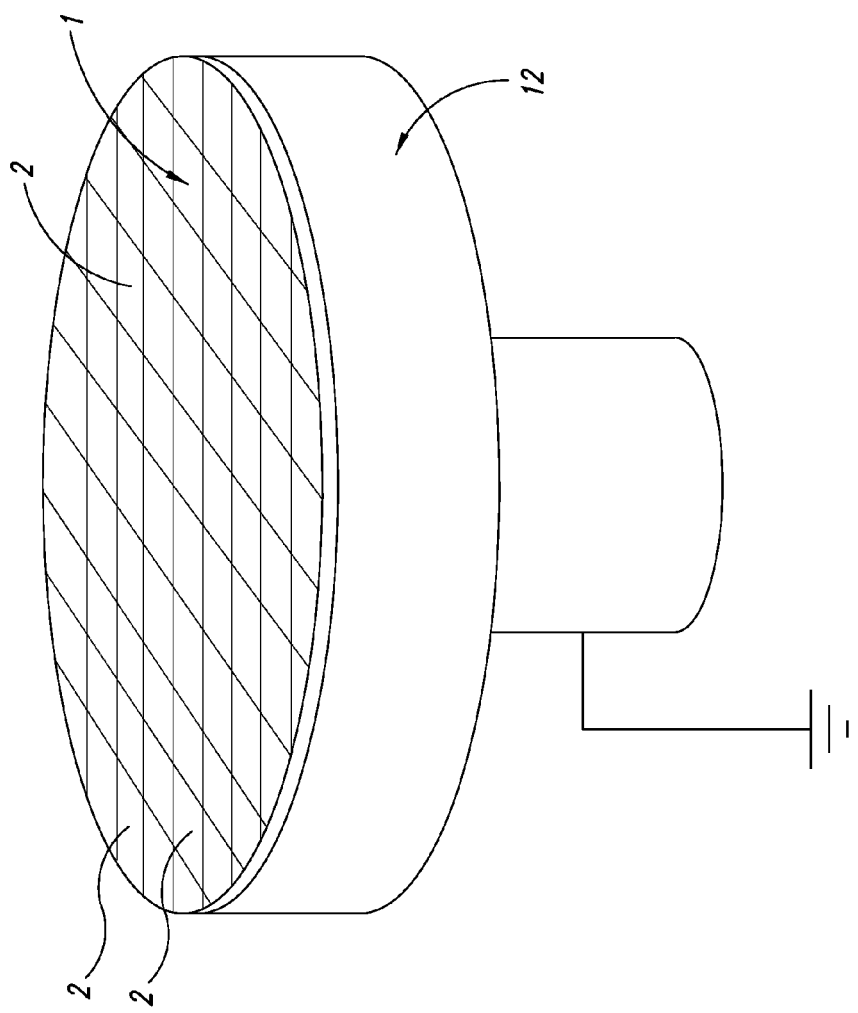
FIG. 1 shows a schematic view of a semiconductor wafer portion incorporating a plurality of electronic devices realized according to the prior art.

With reference to these figures, and in particular to the example of FIG. 1, a wafer of semiconductor material is globally and schematically indicated with 1, several semiconductor electronic devices 2 being neatly provided on a surface of the same according to known monolithic integration techniques.

The wafer 1 is housed on a support 12 which allows electrical connection of the lower or back surface of the wafer, on which the electronic devices 2 are realized, to a reference potential, for example a signal ground or a power supply.

Figures 2A, 2B:
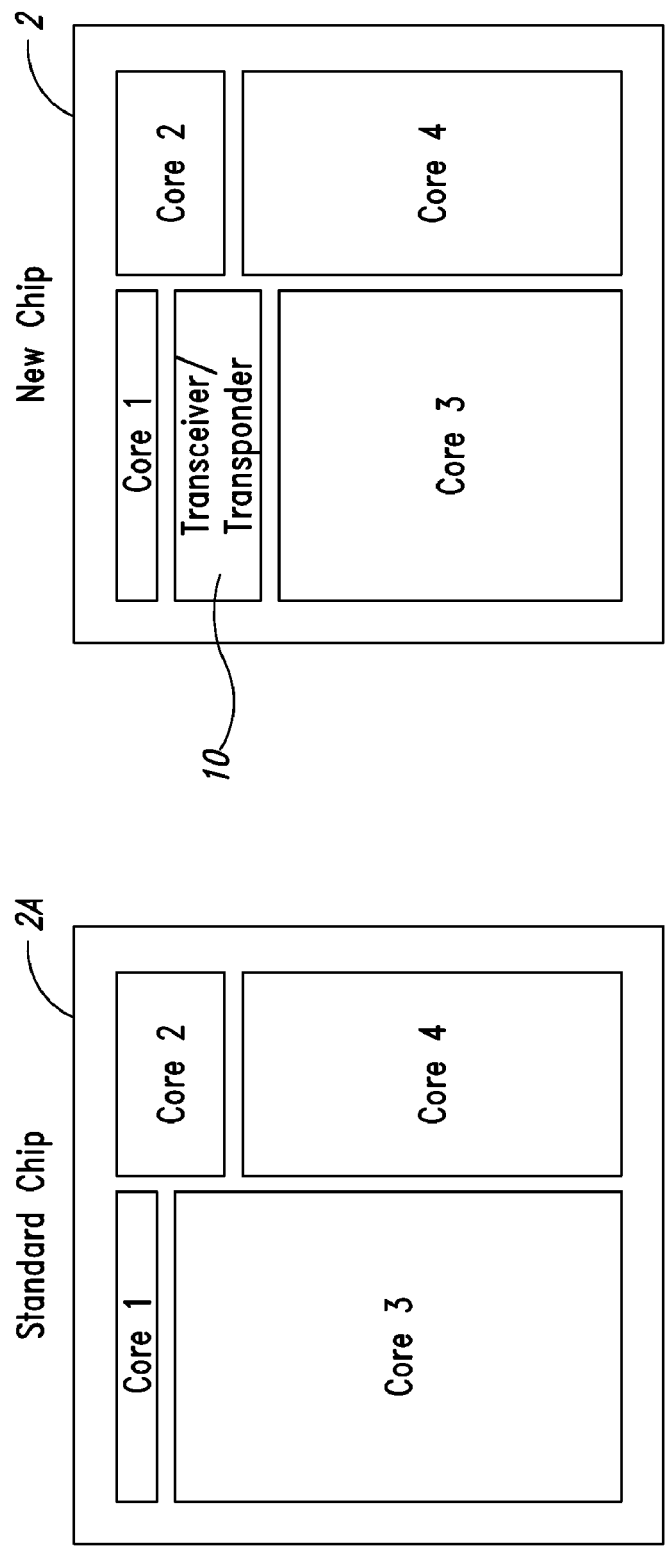
FIGS. 2A and 2B show schematic views comparing a standard electronic device (FIG. 2A) with an electronic device provided with a so called transponder circuit portion (FIG. 2B)

Most of the structure, nature and operation mode of the electronic devices 2 goes beyond the content of the present disclosure. An electronic device 2 according to one embodiment of the present disclosure is shown in FIG. 2B and is provided with a circuit portion 10 of the transceiver or transponder type which can be used for transmitting electric/electromagnetic signals from and towards the electronic device 2 with or without a direct contact or in the so-called wireless mode. An electronic device 2A according to an alternative embodiment of the disclosure is shown in FIG. 2A and does not include such a transceiver or transponder, but could be used in conjunction with the other embodiments discussed herein.

One embodiment of the disclosure relates to a circuit architecture for the parallel supplying of power during the electromagnetic (EMWS) or electric (EWS) testing steps to a plurality of said electronic devices 2 integrated on the semiconductor wafer 1 and provided with at least one transceiver or transponder 10.

Figure 3:
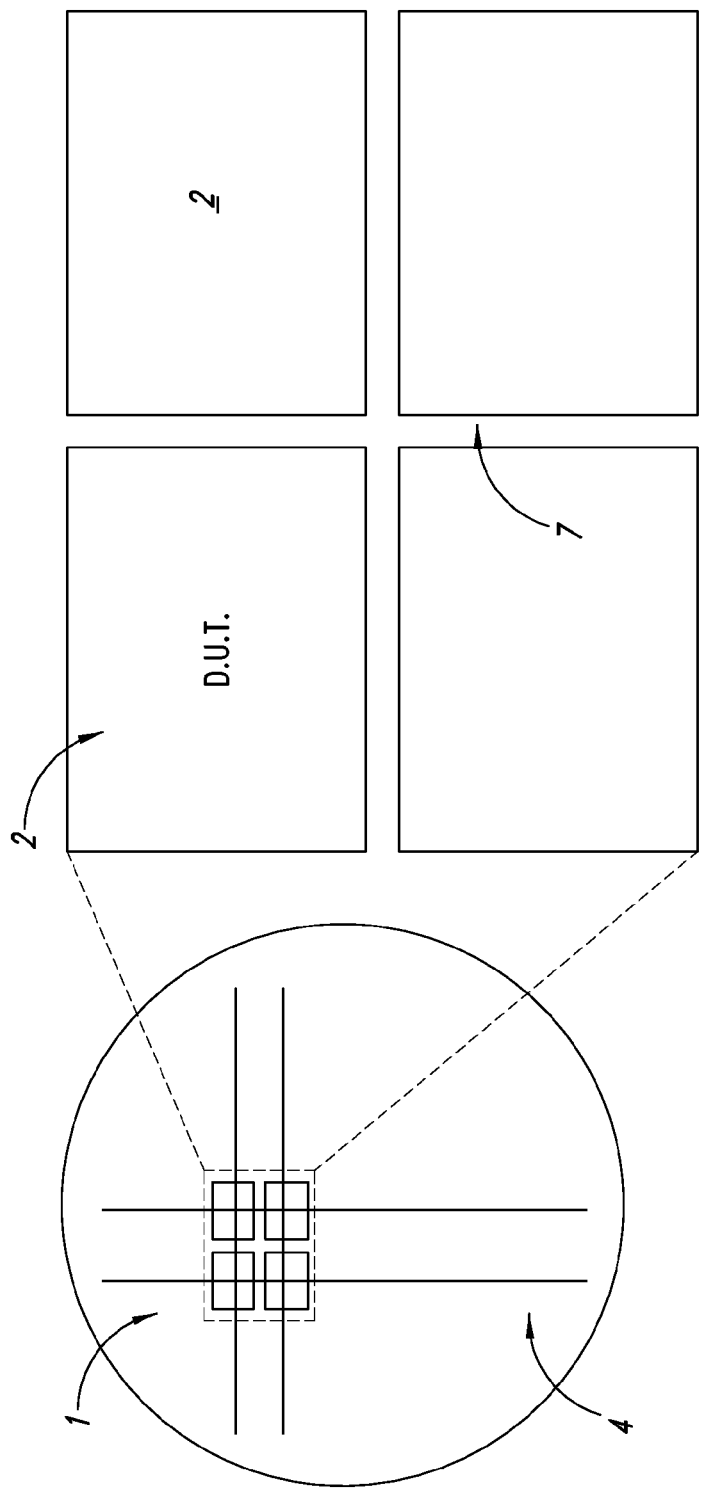
FIG. 3 shows an enlarged scale schematic view of some electronic devices on the wafer of FIG. 1.

Hereafter in the description and in the drawings the electronic devices 2 will be also identified with the acronym DUT (Device Under Test), as shown in FIG. 3.

According to one embodiment of the present disclosure, to supply a sufficient electric power supply so as to make the plurality of devices 2 operative during the EMWS testing step, first the creation of one or more conductive grids 4 on the wafer 1 is provided. The conductive grid 4 can be realized with metallic material or semiconductor material or, in general, with a conductive material. FIG. 3 also shows that a plurality of scribe lines 7, which as is well-known, are separation lines or lowered areas which physically separate the electronic device 2 from each other.

Figure 4:
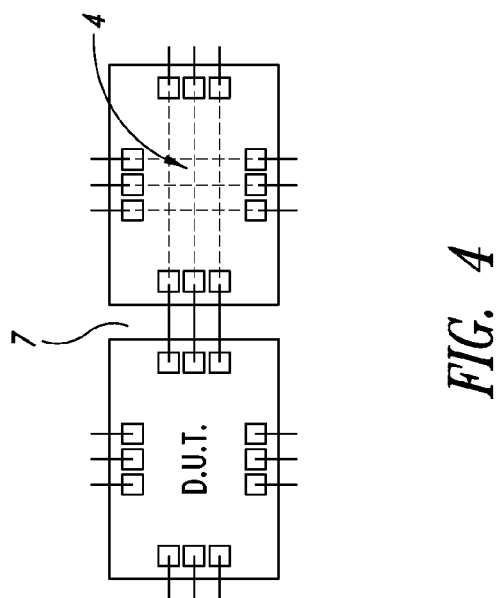
FIG. 4 shows a schematic view of a group of electronic devices realized on a semiconductor wafer and provided with a circuit architecture according to the present disclosure.

FIG. 4 shows an example of a conductive grid 4 according to one embodiment of the present disclosure, together with an embodiment of the circuital architecture always according to the disclosure.

In one embodiment, a single conductive grid 4 for the entire wafer is provided according to the physical structure of the electronic devices 2 and to their modes of realization and implementation onto the wafer 1. Alternatively, the wafer 1 could include plural grids 4 interconnecting the electronic devices 2 within groups of the electronic devices 2.

Figure 7:
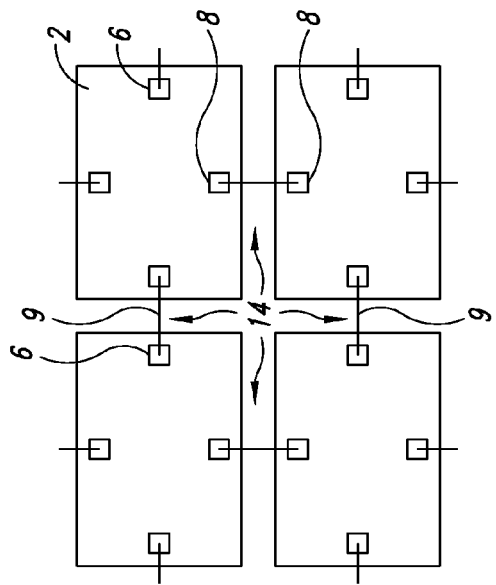
FIG. 7 shows a more detailed schematic view of the connections between the device of FIG. 6 and other similar devices, according to the present disclosure.
Figure 8:
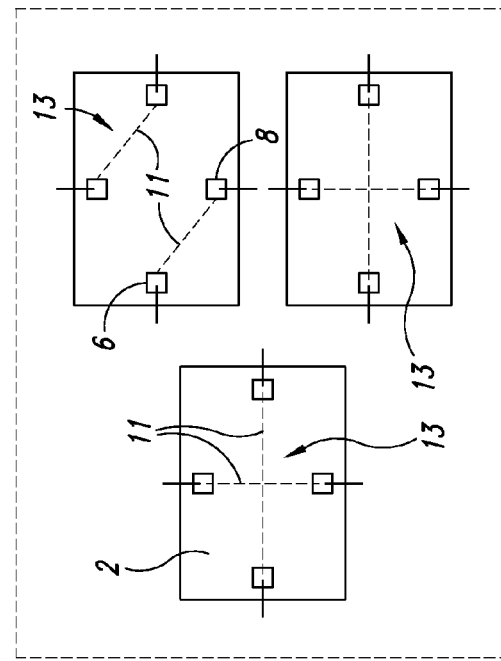
FIG. 8 shows a more detailed schematic view of some electric connection modes inside the electronic devices of FIG. 6 and being part of the circuit architecture of FIG. 7.

Each grid 4 comprises external portions 14, illustrated in FIG. 7, that are external to the various electronic devices 2 and internal portions 13, illustrated in FIG. 8, that are internal to the same electronic devices 2. The external portion 14 of the grid is realized in part inside the scribe lines 7.

In substance, each electronic device 2 is delimited and surrounded by scribe lines 7 which extend orthogonally to each other on the whole semiconductor wafer 1.

A given conductive grid 4 interconnects a group of said electronic devices 2 by the external portion or interconnection network 14 that is external to the devices 2 of said group and the internal portions 13 that are internal to the devices of said group.

For example, FIG. 7 shows a solution wherein the devices 2 are connected to each other by means of the external portions 14 of the conductive grid 4. In FIG. 7, the external portions 14 are implemented using external connections, in particular bridging connections 9, which involve at least one pad 6 of a device 2 and at least another pad 6 of an adjacent device 2.

The bridging connections 9 of said conductive grid 4 are extended across said separation scribe lines 7, while the internal portions 13 of the same conductive grid 4 extend inside at least a part of the electronic devices 2 of each group.

Figure 6:
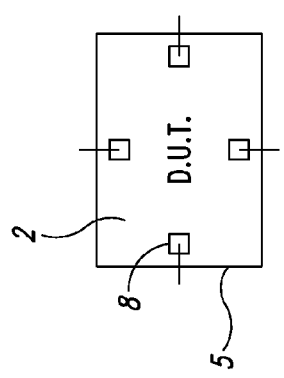
FIG. 6 shows a schematic view of a single electronic device provided with a circuit architecture according to the present disclosure.

Advantageously according to one embodiment of the disclosure, to connect an electronic device 2 to a corresponding grid 4 at least one additional or dummy power supply pad 8 is suitably provided at an edge 5 of the electronic device 2, as shown in FIG. 6. More in particular, one embodiment of the disclosure also provides of a plurality of dummy power supply pads 8, at least one for each edge 5 of the electronic device 2 so as to easily connect each dummy power supply pad 8 to the closest adjacent conductive grid.

The dummy pads 8 can be externally connected to pads 6 already on the electronic devices 2.

The pads 6 or 8 being on a given electronic device 2 and connected to a same grid 4 are also connected to each other, inside the electronic device, through the internal portions 13 of the grid 4, which include internal electric connections 11 of various types. For example, the internal electric connections 11 between the pads 6 or 8 are suitably of the crossing type, and extend inside each device 2 between at least two pads 6 or 8, or 6 and 8.

While the internal electric connections 11 are realized inside each electronic device 2, the bridging connections 9 are created outside the various electronic devices 2, crossing or overlapping the separation scribe lines 7 between the various devices on the wafer.

It is conceptually possible to use some signal or power supply routings already inside the electronic devices 2, but the embodiments of the present disclosure however may provide the arrangement of some additional pads 6 in well defined positions which can serve to abut internal connections 13 or external connections 14.

Figure 5:
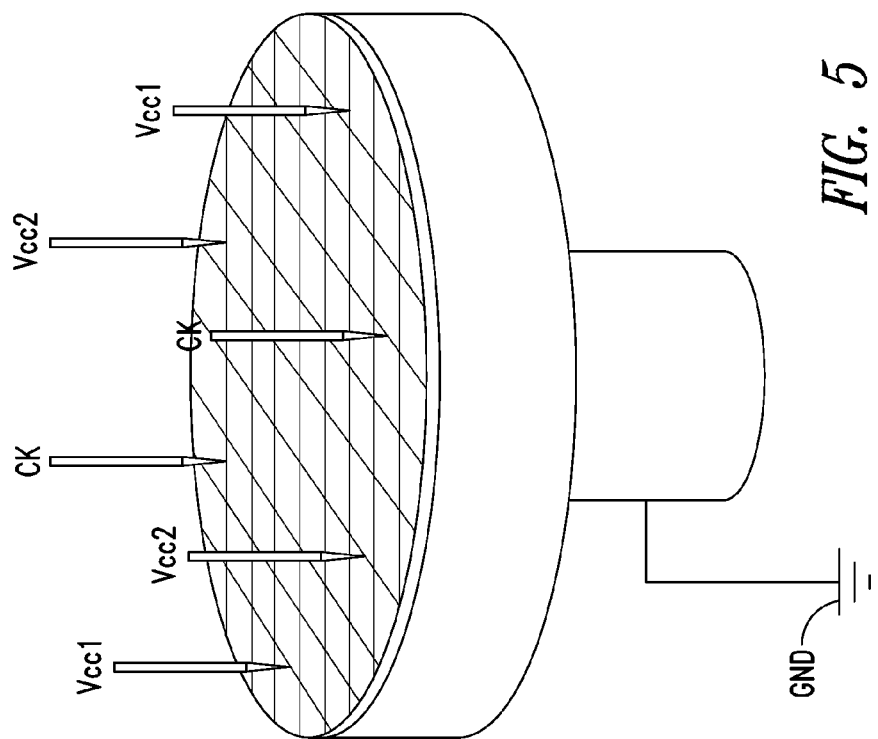
FIG. 5 shows a schematic view, similar to that of FIG. 1, of a semiconductor wafer whereon some electronic devices of FIG. 4 are realized and subjected to testing operations.

By using a mixed solution of external connections 14 and internal connections 13, like the previously shown bridging connection 9 and crossing internal electric connections 11, it is possible to supply each device with also two or more different power supplies Vcc1 and/or Vcc2 or ground GND voltage values, as well as with other electric signals such as for example the clock signal CK, as shown in FIG. 5.

In the case shown in FIG. 5, at least three distinct conductive connections are employed, one for the first supply Vcc1; one for the second supply Vcc2 and one for the clock signal CK.

The connection to a power supply ground can be ensured by the testing apparatus which provides an electric connection to ground for the lower surface of the wafer 1, or this ground connection can be created with a further grid 4.

Figure 9:
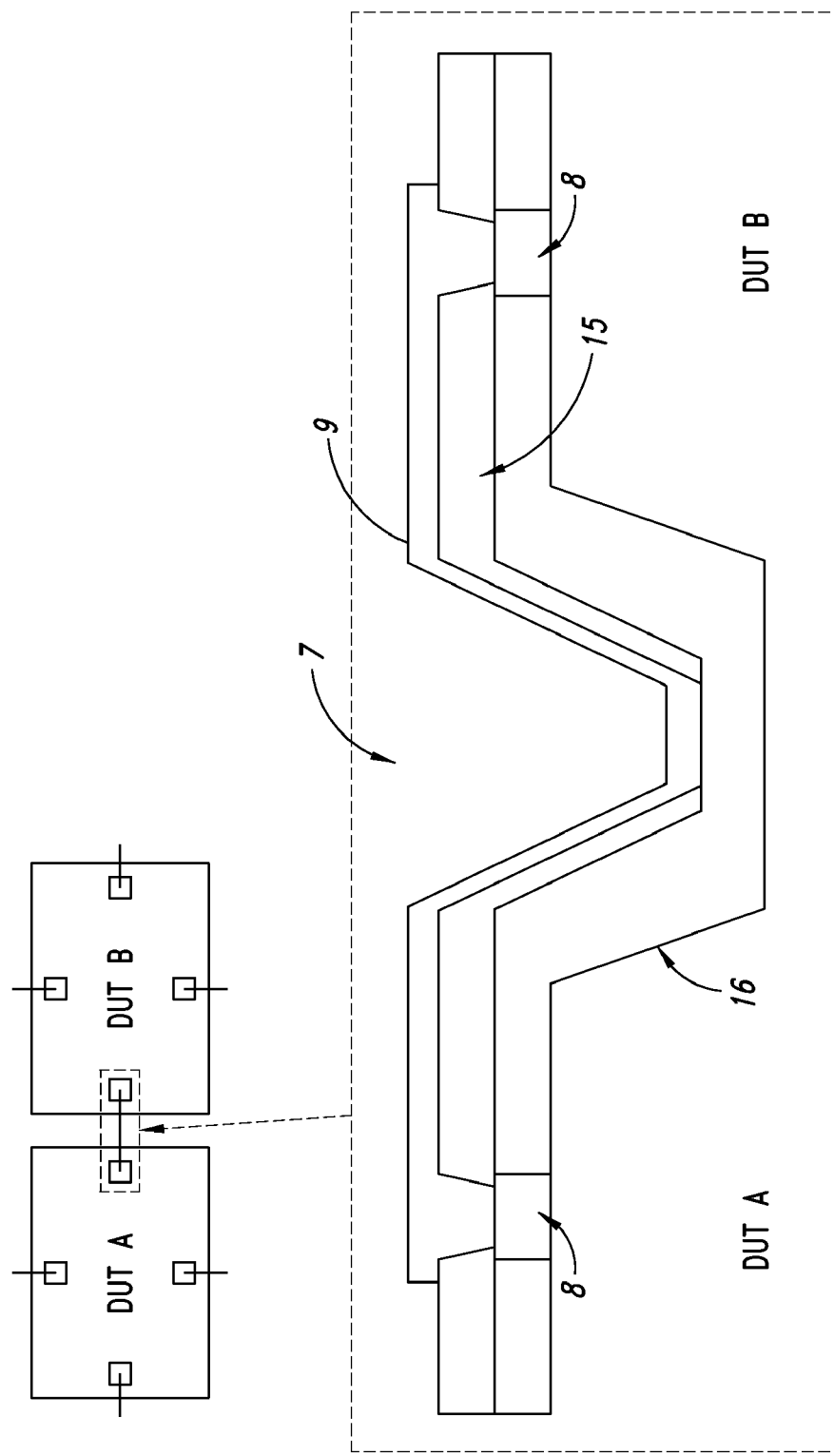
FIG. 9 shows an enlarged vertical section schematic view of a portion of the circuit architecture according to one embodiment of the disclosure.

Going back now to the structure of the external portions 14 of the conductive grids 4, with the help of FIG. 9 it can be understood how it is possible to realize the bridging connections 9 by exploiting also the separation scribe line between a device 2 and the adjacent device 2.

FIG. 9 clearly shows a peripheral additional dummy power supply pad 8 of a device 2, indicated with DUT A, and a similar dummy power supply pad 8 of a second and adjacent device 2, indicated with DUT B, connected to each other by means of a bridging connection 9 formed above a passivation layer 15 which protects an underlying dielectric layer 16 (oxide).

The external bridging connections 9 are realized in the final steps of the diffusion process, or with a dedicated post-processing step, and can then also be removed at the end of the testing step.

Since the bridging connections 9 should cross the scribe lines 7, which are normally lower with respect to the upper surface of the electronic devices, it may be desirable to fill in these scribe lines 7, completely or in part, with electrically insulating, refractory filling material. In this way one contributes to reduce the faultiness in the scribe lines 7 themselves and makes the creation of the bridging connections 9 easier.

Figure 10:
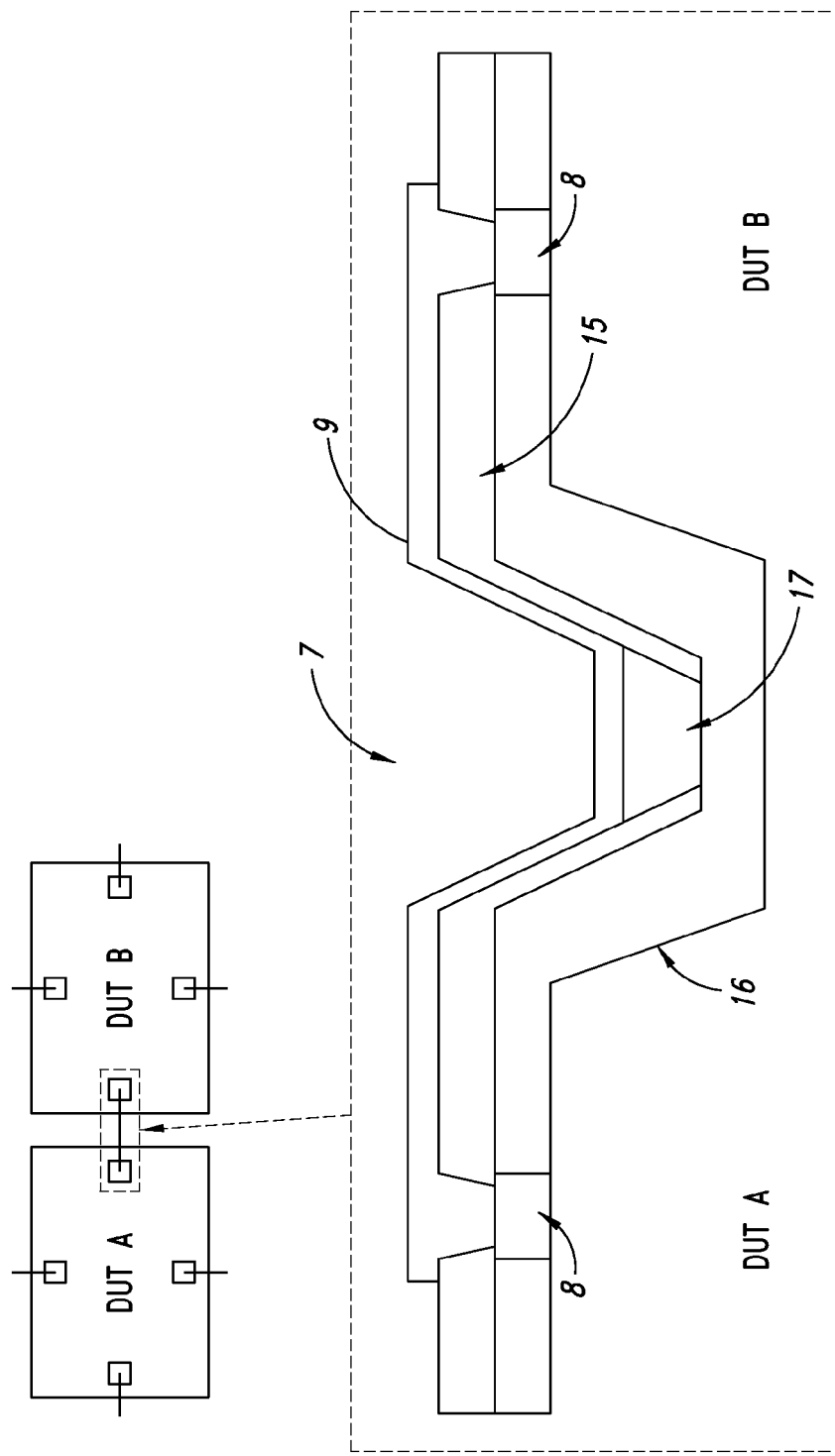
FIG. 10 shows an enlarged vertical section schematic view of one embodiment of the circuit architecture portion of FIG. 9.

In fact, in a further embodiment shown in FIG. 10, the bridging connection 9 is deposited above a layer 17 of filling insulating material, for example an oxide, expressly provided as partial filler of the lowered region of the scribe line 7.

If instead there is no difference of level between the surface of the scribe lines 7 and the surface of the various electronic devices 2, the realization of the bridging connections 9 can occur also without a precautionary deposition of filling insulating material 17.

Figure 11:
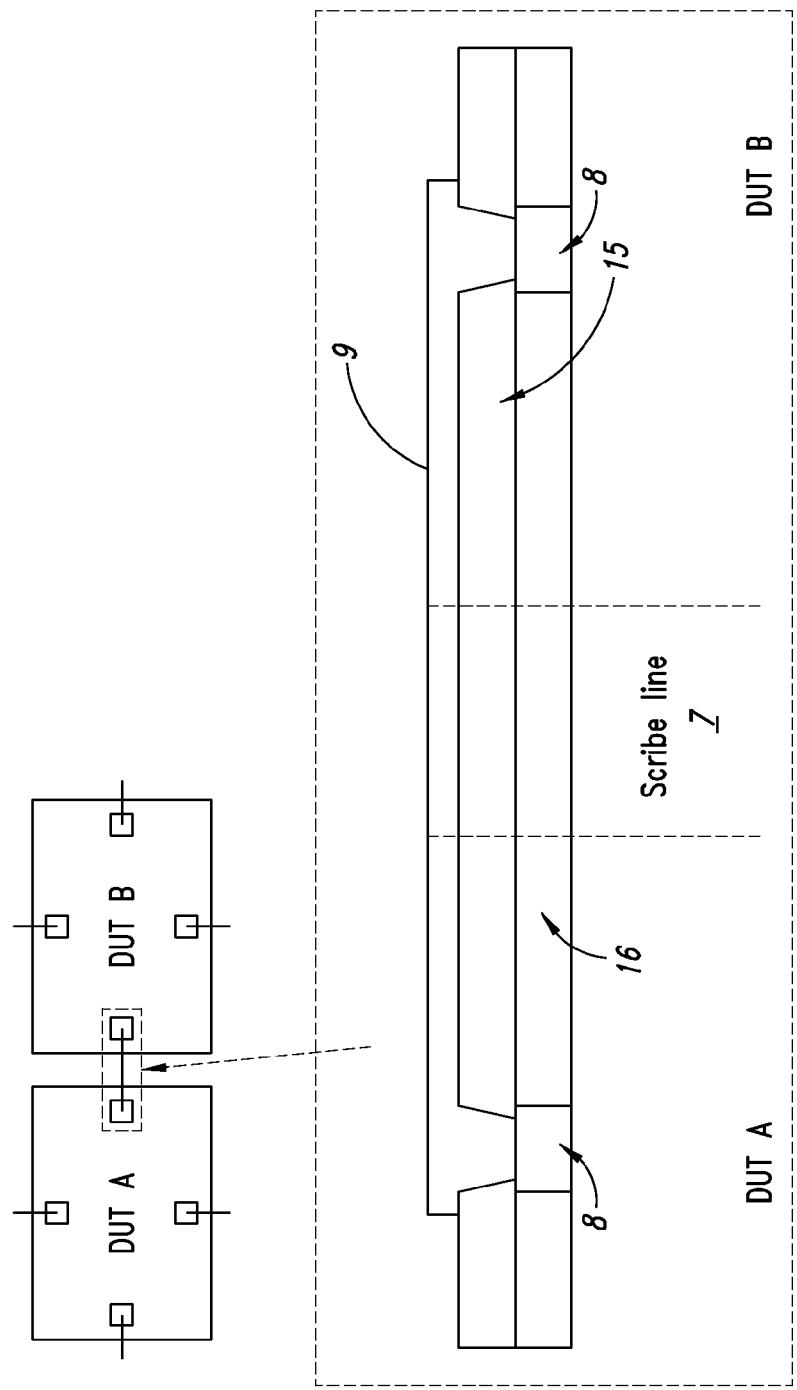
FIG. 11 shows an enlarged vertical section schematic view of one embodiment of the circuit architecture of FIG. 9.

In fact, in case the scribe line 7 is not lowered with respect to the at sight surface of the electronic devices 2 realized on the wafer 1, the external connection 14 can be flat and completely extended above the passivation layer 15, as shown in FIG. 11.

One will recognize that the internal electric connections 11 are the internal portions 13 of each device 2 of the conductive grid 4.

One skilled in the field will understand that it is possible to arrange the crossing in different ways, according to the circumstances. For example, a possible configuration for the crossing considers that inside the electronic device 2 the pads 6 or 8 of the same type, i.e. of signal or of power supply, are all connected to each other, so as to reduce the overall number of probes used for supplying power.

Advantageously, the various electronic devices 2 arranged on a same wafer 1 are, according to one embodiment of the disclosure, connected to each other outside the devices themselves, by exploiting the dummy power supply pads 8 and the connections 9; while, the internal electric connections 11 between the same dummy power supply pads 8 will ensure the electrical continuity of a given conductive grid 4.

The bridging connections 9 will have the possibility of being eliminated in any case after the testing step or after the cut of the wafer 1 for the physical separation of the electronic devices 2 so as to encapsulate each electronic device 2 inside a respective containment and protection package.

To supply the various conductive grids 4 traditional probes can be used by the apparatuses arranged for the electric testing on wafer, and possibly, for a same power supply, a plurality of dummy probes can be used.

The presence of this plurality of dummy probes allows to supply all the power required by the operation of the various electronic devices 2, thus solving possible anomalous contact resistance problems due to the power flowing between the probes and the various conductive grids 4.

Moreover, the dummy probes help to reduce the effect of the resistance of the conductive grids 4.

The ground pad of the various electronic devices 2 can also be in common, and can be provided by means of the probes or by means of the so-called chuck of the prober.

As already seen, besides the power supplying, the conductive grids 4 can also supply some signals to the various devices on the wafer.

The disclosure attains several advantages. For example, one embodiment of the present disclosure, makes the process of EMWS testing through electromagnetic (in part or completely) communication between tester and wafer possible, strong and reliable, and can be used also for the EWS electric testing or for the wafer level burn-in WLBI.

In consequence, thanks to the disclosure, it is possible to enormously increase the testing parallelism, with subsequent reduction of the costs and/or of the test times, until reaching a parallel testing even of all the electronic devices 2 of a same wafer 1.

Moreover, possible bonding problems during the assembly step are reduced, which can be caused by the damaging or possible abrasion of the pads 6 due to the contact with the probes for the electric testing.

Now, with particular reference to the example of FIGS. 12 to 19 some other embodiments of the circuit architecture according to the present disclosure are described.

In these other examples also some details and cooperating parts having the same structure and operation as the previous embodiments will be described and for them the same reference numbers will be used.

To supply a plurality of devices 2 with at least one power supply and possibly at least one signal, alternative solutions can be used with respect to those of the previous examples.

Figure 12:
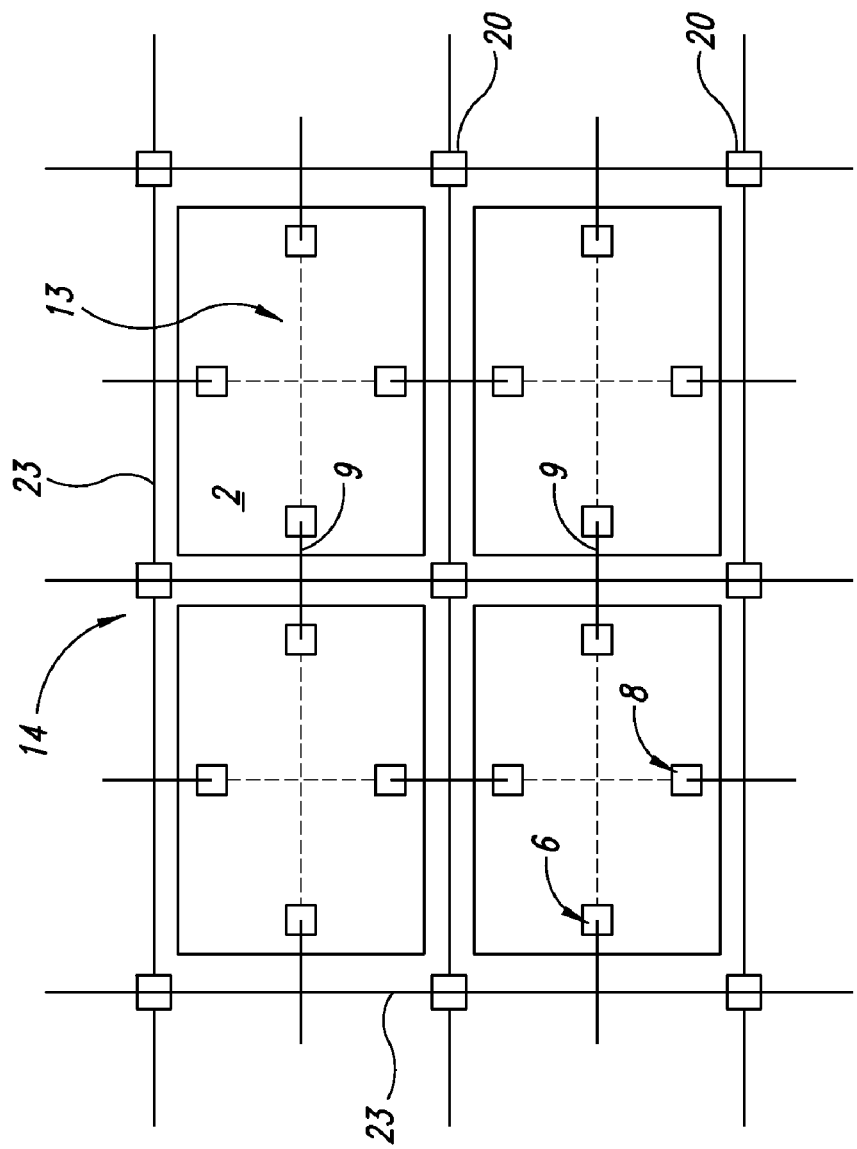
FIG. 12 shows a schematic view of a group of electronic devices realized on a semiconductor wafer and provided with a circuit architecture according to one embodiment of the present disclosure.

In fact, the external portions 14 of the conductive grid 4 may include conductive lines 23 extending lengthwise inside the scribe lines 7 and orthogonally to each other, which connect more devices 2 to each other, as shown in FIG. 12.

At the crossing point between the orthogonal lines 23, an insulation material such as silicon oxide 20, as shown in FIG. 12, may be provided, so as to prevent a short circuit.

Figure 13:
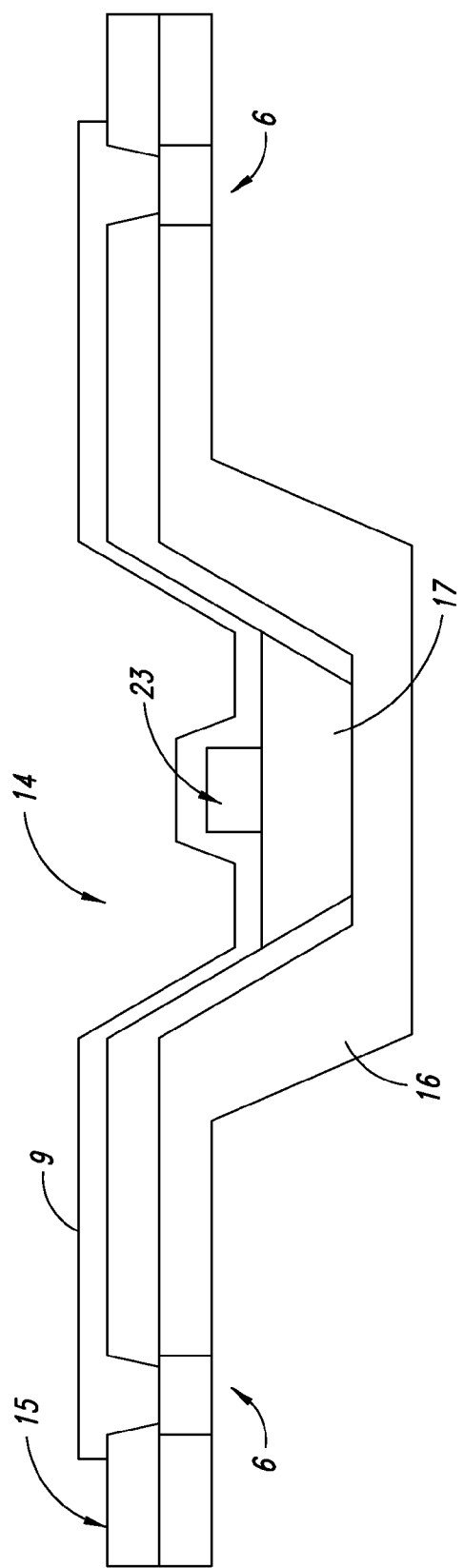
FIG. 13 shows an enlarged vertical section schematic view of a circuit architecture portion on the semiconductor wafer of FIG. 12.
Figure 14:
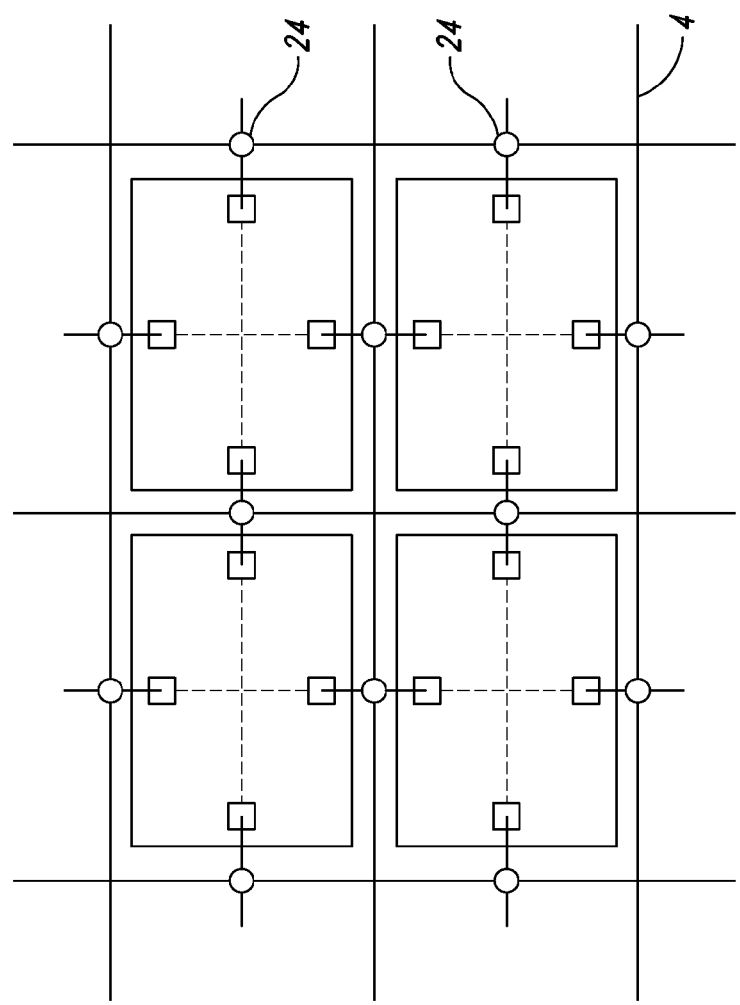
FIG. 14 shows a schematic view of a group of electronic devices realized on a semiconductor wafer and provided with a circuit architecture according to one embodiment of the present disclosure.

The external portions 14 of the conductive grid 4 also includes conductive bridging connections 9 that connect the pads 6 and 8 of two adjacent devices 2 to each other, and are electrically connected to the conductive lines 23, as shown in FIG. 13. In FIG. 13, the conductive lines 23 and the bridging connections 9 extend on the insulating material 16, 17 which is positioned along a bottom portion of each scribe line 7.

Inside the generic device 2 the pads 6 and 8 are connected to each other by means of the internal electric connections 11 (of the crossing type) of the conductive grid 4.

Alternatively, at least one or even all the conductive lines 23 can be buried in an insulating layer 21 formed in the scribe line 7, as shown in FIGS. 15 and 16. In such an embodiment, the insulating layer 21 extends along the entire length of each scribe line 7. Also, the conductive lines 23 are insulated from each other by the insulating layer 21 as shown in FIG. 16. That is, a first conductive line 23 extending in a first direction underlies a second conductive line 23 extending in a second direction orthogonal to the first direction, and both conductive lines 23 are surrounded by the insulating layer 21.

As shown in FIG. 15, an electric connection via 22 connects the generic buried conductive line 23 to one of the bridging connections 9. Such a via 22 thus creates an interconnection 24, of the conductive grid 4 shown in FIG. 14.

Figure 17:
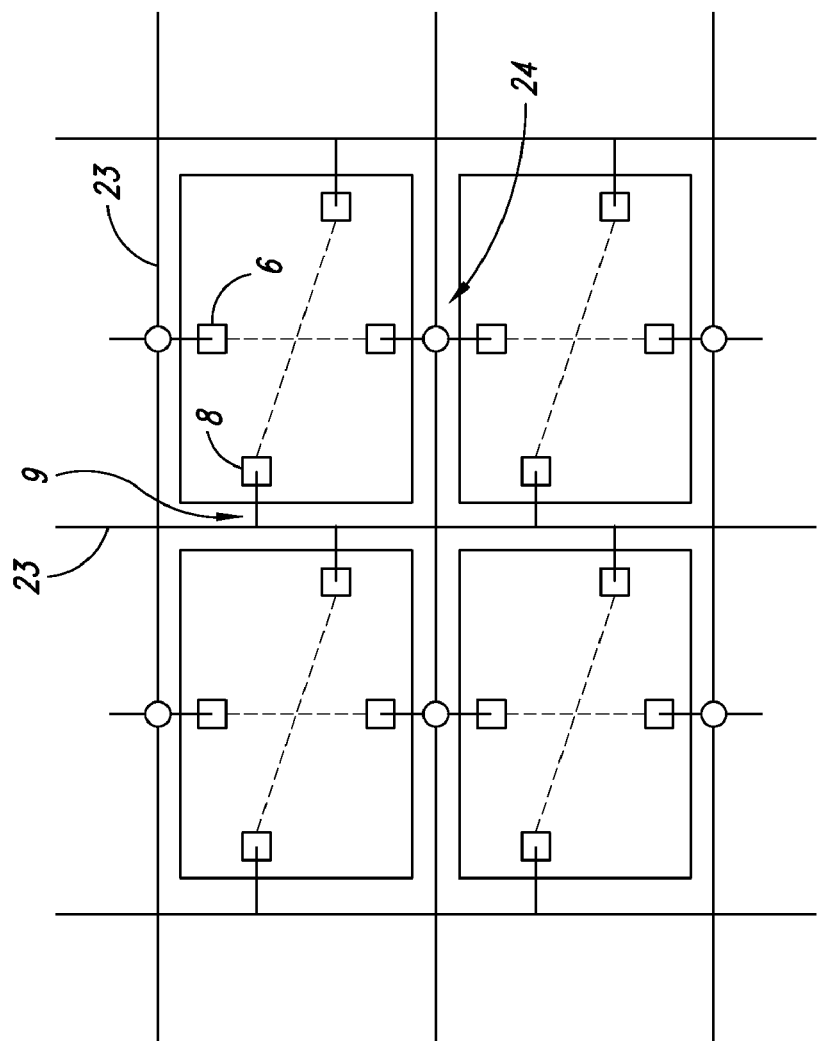
FIG. 17 shows a schematic view of a group of electronic devices realized on a semiconductor wafer and provided with a circuit architecture according to one embodiment of the present disclosure.

In an alternative embodiment, the conductive grid 4 includes a non-buried conductive line 23 in each scribe line 7, and some conductive bridging connections 9 to connect the generic pads 6, 8 to one of the conductive lines 23, as shown in FIG. 17.

Figure 18:
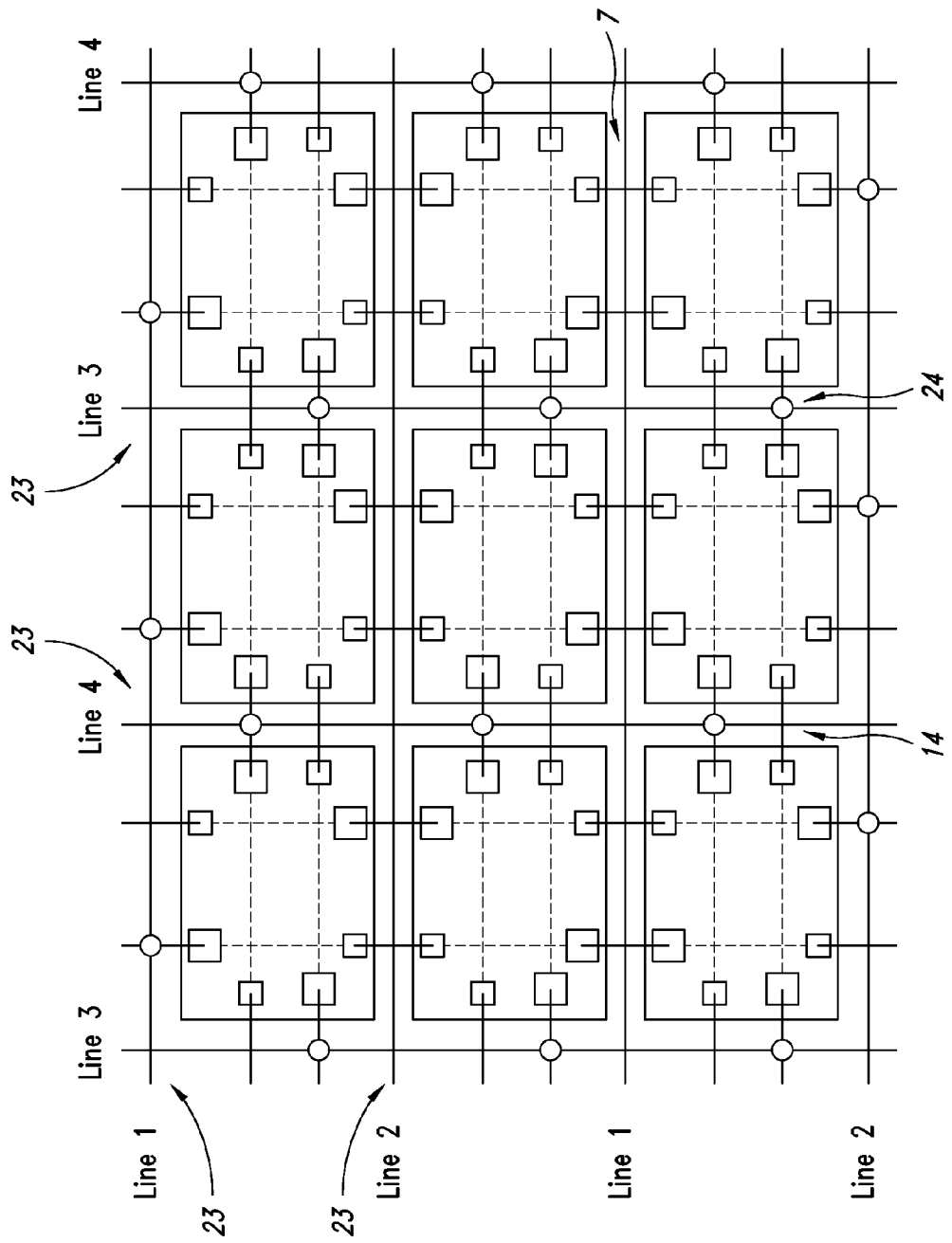
FIG. 18 shows a schematic view of a group of electronic devices realized on a semiconductor wafer and provided with a circuit architecture according to one embodiment of the present disclosure.

Alternatively, the conductive grid 4 includes conductive lines 23 buried in an insulating layer 21 in the scribe line 7 or not, bridging connections 9 without interconnections 24, and bridging connections 9 with interconnections 24, as shown in FIG. 18.

Figure 19:
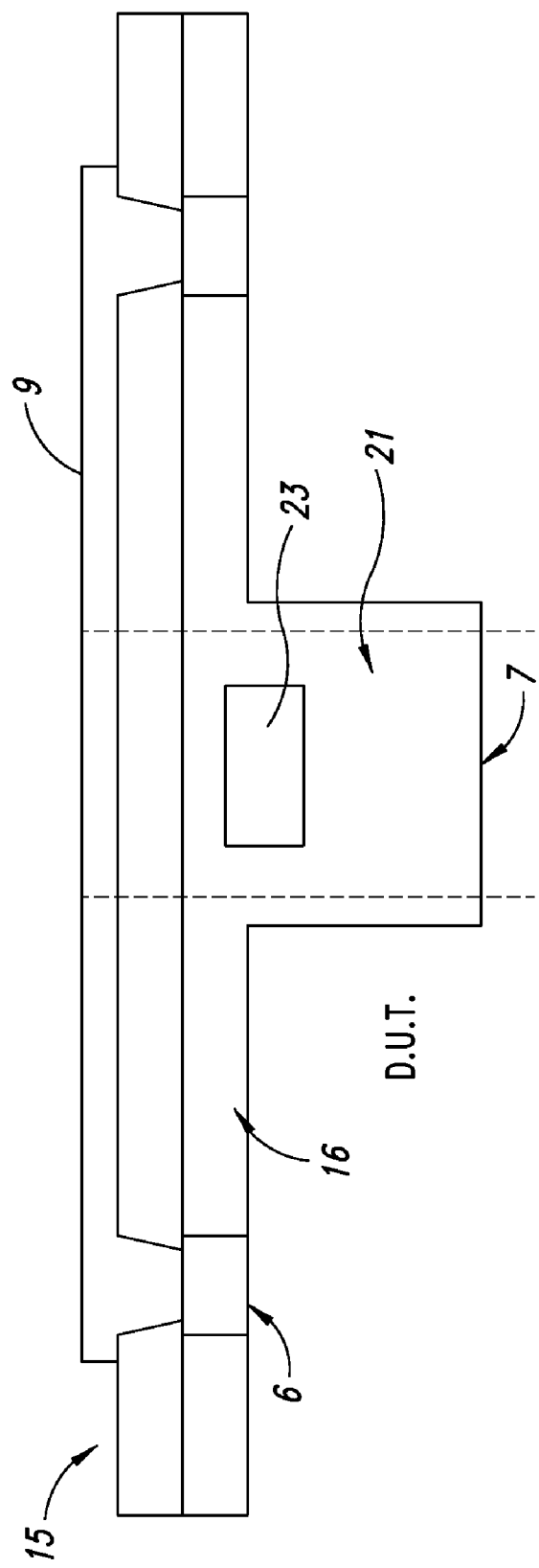
FIG. 19 shows an enlarged vertical section schematic view of a circuit architecture portion on the semiconductor wafer of FIG. 18.

In particular, as shown in FIG. 19, a generic bridging connection 9 without an interconnection 24 crosses the scribe line 7 on the passivation layer 15 and thus is insulated by the passivation layer 15 from the conductive line 23 which is buried in the insulating layer 21 of the scribe line 7.

The metallic connections and the power supply grids may be then eliminated in any case after the testing by cutting the wafer into dice and encapsulating the various devices 2 in suitable packages.

Figure 20:
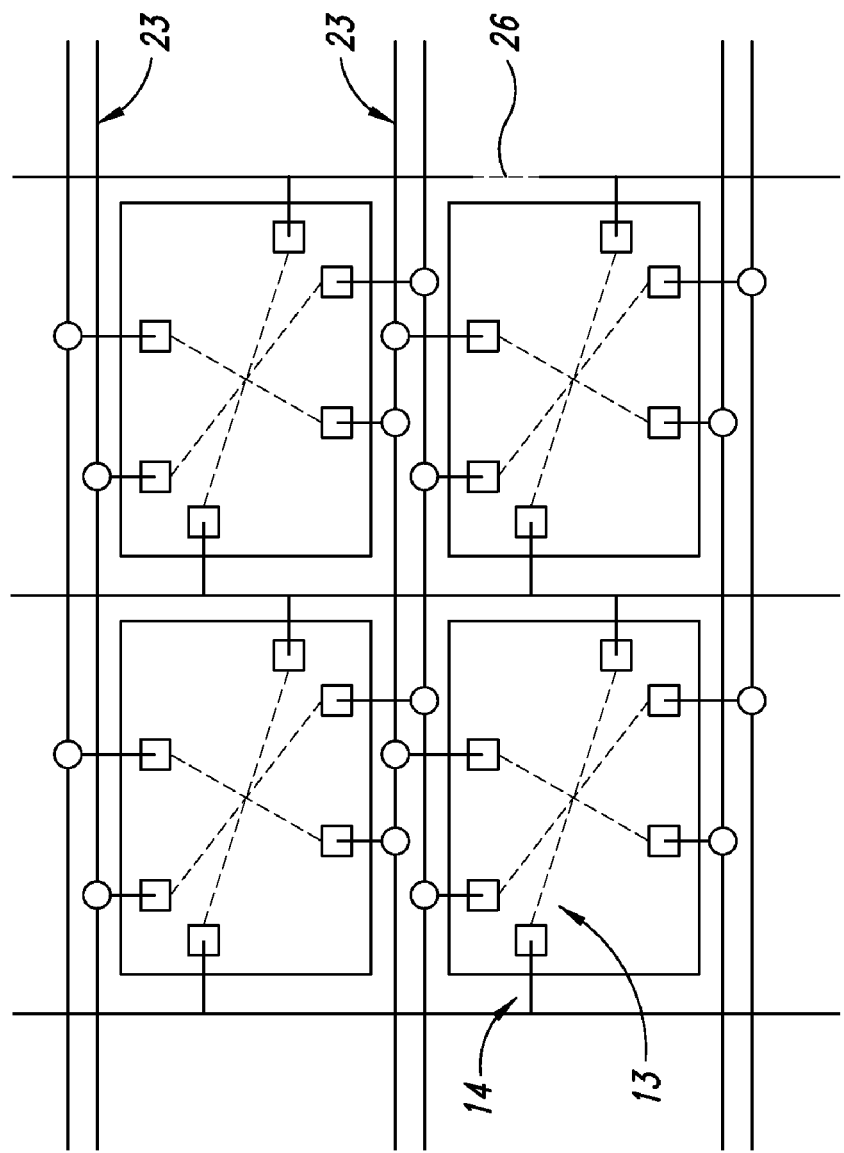
FIG. 20 shows a schematic view of a group of electronic devices realized on a semiconductor wafer and provided with a circuit architecture according to one embodiment of the present disclosure.

Alternatively, it is also possible to simultaneously use bridging connections 9 without vias 22 and bridging connections 9 with vias 22 ending in correspondence with the scribe lines 7, so as to create the conductive grid 4 as shown in FIG. 20.

Figure 21:
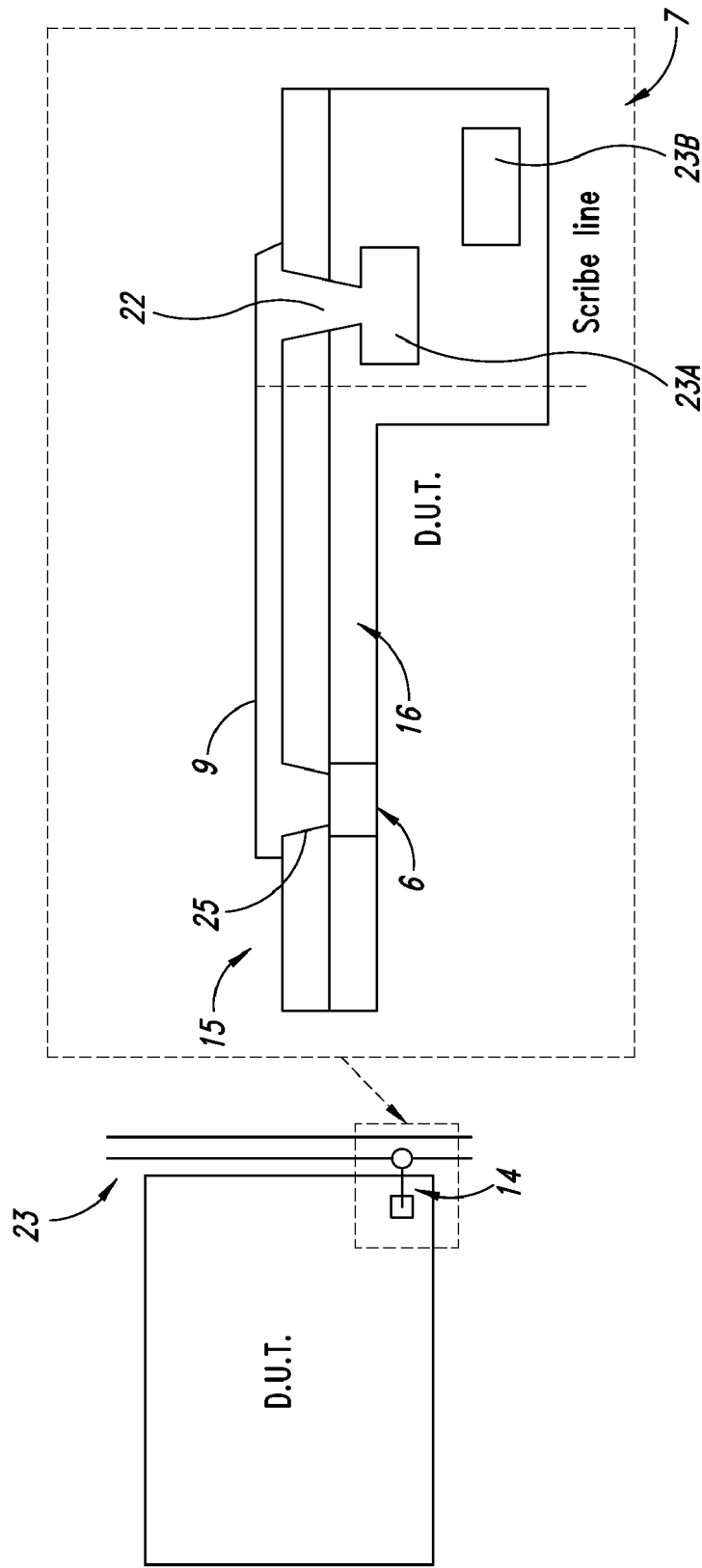
FIG. 21 shows an enlarged vertical section schematic view of one embodiment of the circuit architecture of FIG. 9.

In particular, as shown in FIG. 21, the bridging connection 9 starts from a via 22, connecting the bridging connection 9 to a first conductive line 23A of the conductive lines 23 in correspondence with the scribe line 7, and reaches another via 25 connecting the bridging connection 9 to the pad 6 through the passivation layer 15. The bridging connection 9 is insulated from a second conductive line 23B of the conductive lines 23 which is buried in the insulator 21 of the scribe line 7.

It is also to be considered that possible protection circuits, for example for the short circuits, are comprised within the generic device 2, or possibly can be also outside the same by incorporating them in at least one conductive grid 4, realizing for example at least one fuse link 26 connected to the conductive grid 4 and/or incorporated therein, as shown in FIG. 20.

In this sense, the generic conductive line can be designed so that the same incorporates at least one fuse link in at least one section of this line, so that if a certain current value is overcome, the overheating of the conductive line will lead to a local fusion of said line interrupting the line itself.

The present disclosure thus also relates to a method comprising the steps of:

forming the scribe lines 7 on the semiconductor wafer 1;

forming the plurality of electronic devices 2 integrated on the semiconductor wafer 1 separated from each other by the scribe lines 7;

forming the plurality of interconnection pads 6 on each electronic device 2 respectively;

forming the conductive grid 4 on the semiconductor wafer 1. In particular, the step of forming the conductive grid 4 further includes the steps of:

forming the external portion 14 of the conductive grid 4 along the scribe lines 7;

forming the internal portion 13 of the conductive grid 4 within the electronic devices 2; and connecting an interconnection pad 6 of each electronic device 2 to an interconnection pad 6 of a respective adjacent electronic device 2 and to the conductive grid 4 to form power supply lines common to the electronic devices 2.

Advantageously according to one embodiment of the disclosure, the step of forming the internal portion 13 comprises electrically connecting two interconnection pads 6 of a same electronic device 2.

Moreover, the method further comprises a step of supplying a voltage to all of the electronic devices 2 simultaneously through the conductive grid 4.

In particular, the method may comprise a step of simultaneously testing of the electronic devices 2.

The disclosure makes it possible, strong and industrially applicable the EWS testing process through electromagnetic (in part or completely) communication between tester and wafer.

In consequence, the disclosure allows to enormously increase the testing parallelism, with subsequent reduction of the costs, testing times, etc. so as to attain a testing in parallel of all the devices on the wafer.

Moreover, the bonding problems at the assembly caused by the damaging of the pads, currently caused by the probes for the electric testing, are reduced.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification are incorporated herein by reference, in their entirety. Aspects of the embodiments can be modified, to employ concepts of the various patents, applications and publications to provide yet further embodiments.

The invention claimed is:

1. A semiconductor wafer configured for wafer level testing, comprising:
   a plurality of electronic devices integrated on the semiconductor wafer wherein said electronic devices have edges;
   separation scribe lines bounding the edges of the electronic devices and separating the electronic devices from each other;
   a conductive grid interconnecting a group of said electronic devices and having an external portion external to the electronic devices of said group and an internal portion internal to the electronic devices of said group, the external portion of said conductive grid extending along said separation scribe lines, and the internal portion extending within the electronic devices of said group;
   interconnection pads positioned on the electronic devices of the group and coupling said external portion and said internal portion of said conductive grid being provided on the electronic devices of said group, said interconnection pads forming, along with said internal and external portions, power supply lines which are common to different electronic devices of said group; and
   an external passivation layer positioned on the separation scribe lines and on the electronic devices of said group, wherein the interconnection pads include first and second interconnection pads, the separation scribe lines include a first separation scribe line positioned between the first and second interconnection pads, and the conductive grid includes a conductive first bridging connection electrically coupled between the first and second interconnection pads and extending on an external surface of a portion of the external passivation layer that is positioned on the first separation scribe line wherein said internal portion includes crossing connections coupled between respective pairs of the interconnection pads.

2. The semiconductor wafer according to claim 1, wherein each electronic device of said group comprises a power supply pad at one of the edges of the electronic device, the power supply pad being connected with the external portion of said conductive grid.

3. The semiconductor wafer according to claim 1, wherein each electronic device of said group comprises a plurality of power supply pads at the edges of the electronic device, each power supply pad being connected to the external portion of said conductive grid.

4. The semiconductor wafer according to claim 2, wherein said external portion includes a conductive second bridging connection coupled between power supply pads of adjacent electronic devices of the group.

5. The semiconductor wafer according to claim 1, wherein one of the electronic devices of the group includes two interconnection pads and said internal portion includes an electric connection between the interconnection pads.

6. A semiconductor wafer configured for wafer level testing, comprising:
   a plurality of electronic devices integrated on the semiconductor wafer wherein said electronic devices have edges;
   separation scribe lines bounding the edges of the electronic devices and separating the electronic devices from each other;
   conductive grid interconnecting a group of said electronic devices and having an external portion external to the electronic devices of said group and an internal portion internal to the electronic devices of said group, the external portion of said conductive grid extending along said separation scribe lines, and the internal portion extending within the electronic devices of said group;
   interconnection pads positioned on the electronic devices of the group and coupling said external portion and said internal portion of said conductive grid being provided on the electronic devices of said group, said interconnection pads forming, along with said internal and external portions, power supply lines which are common to different electronic devices of said group;
   an external passivation layer positioned on the separation scribe lines and on the electronic devices of said group, wherein the interconnection pads include first and second interconnection pads, the separation scribe lines include a first separation scribe line positioned between the first and second interconnection pads, and the conductive grid includes a conductive first bridging connection electrically coupled between the first and second interconnection pads and extending on an external surface of a portion of the external passivation layer that is positioned on the first separation scribe line; and
   an insulating layer positioned on said first separation scribe line, wherein the first and second interconnection pads extend through the insulating layer, the external passivation layer is positioned on said insulating layer, and the conductive first bridging connection extends on the insulating and external passivation layers and between the respective interconnection pads of the two adjacent electronic devices.

7. A semiconductor wafer configured for wafer level testing, comprising:
   a plurality of electronic devices integrated on the semiconductor wafer wherein said electronic devices have edges;
   separation scribe lines bounding the edges of the electronic devices and separating the electronic devices from each other;
   a conductive grid interconnecting a group of said electronic devices and having an external portion external to the electronic devices of said group and an internal portion internal to the electronic devices of said group, the external portion of said conductive grid extending along said separation scribe lines, and the internal portion extending within the electronic devices of said group;
interconnection pads positioned on the electronic devices of the group and coupling said external portion and said internal portion of said conductive grid being provided on the electronic devices of said group, said interconnection pads forming, along with said internal and external portions, power supply lines which are common to different electronic devices of said group; and
an external passivation layer positioned on the separation scribe lines and on the electronic devices of said group, wherein the interconnection pads include first and second interconnection pads, the separation scribe lines include a first separation scribe line positioned between the first and second interconnection pads, and the conductive grid includes a conductive first bridging connection electrically coupled between the first and second interconnection pads and extending on an external surface of a portion of the external passivation layer that is positioned on the first separation scribe line, wherein:
the external portion of the conductive grid includes a conductive line extending longitudinally within said first separation scribe line;
the conductive first bridging connection extends between the first interconnection pad and the conductive line; and
the conductive grid includes a conductive second bridging connection extending between the second interconnection pad and the conductive line, the first and second interconnection pads being electrically coupled to each other by the conductive first bridging connection and conductive second bridging connection and the conductive line.

8. A semiconductor wafer configured for wafer level testing, comprising:
a plurality of electronic devices integrated on the semiconductor wafer wherein said electronic devices have edges;
separation scribe lines bounding the edges of the electronic devices and separating the electronic devices from each other;
a conductive grid interconnecting a group of said electronic devices and having an external portion external to the electronic devices of said group and an internal portion internal to the electronic devices of said group, the external portion of said conductive grid extending along said separation scribe lines, and the internal portion extending within the electronic devices of said group;
interconnection pads positioned on the electronic devices of the group and coupling said external portion and said internal portion of said conductive grid being provided on the electronic devices of said group, said interconnection pads forming, along with said internal and external portions, power supply lines which are common to different electronic devices of said group; and
an external passivation layer positioned on the separation scribe lines and on the electronic devices of said group, wherein the interconnection pads include first and second interconnection pads, the separation scribe lines include a first separation scribe line positioned between the first and second interconnection pads, and the conductive grid includes a conductive first bridging connection electrically coupled between the first and second interconnection pads and extending on an external surface of a portion of the external passivation layer that is positioned on the first separation scribe line, wherein said interconnection pads comprise power supply dummy pads and signal dummy pads.

9. The semiconductor wafer according to claim 1, wherein said external portion and said internal portion of said conductive grid are orthogonal to each other.

10. A semiconductor wafer configured for wafer level testing, comprising:
a plurality of electronic devices integrated on the semiconductor wafer wherein, said electronic devices have edges;
separation scribe lines bounding the edges of the electronic devices and separating the electronic devices from each other;
a conductive grid interconnecting a group of said electronic devices and having an external portion external to the electronic devices of said group and an internal portion internal to the electronic devices of said group, the external portion of said conductive grid extending along said separation scribe lines, and the internal portion extending within the electronic devices of said group;
interconnection pads positioned on the electronic devices of the group and coupling said external portion and said internal portion of said conductive grid being provided on the electronic devices of said group, said interconnection pads forming, along with said internal and external portions, power supply lines which are common to different electronic devices of said group; and
an external passivation layer positioned on the separation scribe lines and on the electronic devices of said group, wherein the interconnection pads include first and second interconnection pads, the separation scribe lines include a first separation scribe line positioned between the first and second interconnection pads, and the conductive grid includes a conductive first bridging connection electrically coupled between the first and second interconnection pads and extending on an external surface of a portion of the external passivation layer that is positioned on the first separation scribe line, wherein said external portion includes a set of conductive lines extending lengthwise in the scribe lines, respectively.

11. The semiconductor wafer according to claim 10, wherein the set of conductive lines includes first conductive lines extending substantially parallel to each other and second conductive lines extending substantially parallel to each other and substantially orthogonally to the first conductive lines, said first conductive lines being insulated from the second conductive lines at crossover points.

12. A semiconductor wafer configured for wafer level testing, comprising:
a plurality of electronic devices integrated on the semiconductor wafer wherein said electronic devices have edges;
separation scribe lines bounding the edges of the electronic devices and separating the electronic devices from each other;
a conductive grid interconnecting a group of said electronic devices and having an external portion external to the electronic devices of said group and an internal portion internal to the electronic devices of said group, the external portion of said conductive grid extending along said separation scribe lines, and the internal portion extending within the electronic devices of said group;
interconnection pads positioned on the electronic devices of the group and coupling said external portion and said internal portion of said conductive grid being provided on the electronic devices of said group, said interconnection pads forming, along with said internal and external portions, power supply lines which are common to different electronic devices of said group;
an external passivation layer positioned on the separation scribe lines and on the electronic devices of said group, wherein the interconnection pads include first and second interconnection pads, the separation scribe lines include a first separation scribe line positioned between the first and second interconnection pads, and the conductive grid includes a conductive first bridging connection electrically coupled between the first and second interconnection pads and extending on an external surface of a portion of the external passivation layer that is positioned on the first separation scribe line; and
an insulating layer extending within and at least partially filling said first separation scribe line, wherein:
the external portion includes a conductive line buried in said insulating layer;
the conductive first bridging connection and the external passivation layer are positioned on said insulating layer; and
the external portion includes a connection via extending through the insulating and external passivation layers and connecting the conductive first bridging connection to said buried conductive line.

13. A semiconductor wafer configured for wafer level testing, comprising:
a plurality of electronic devices integrated on the semiconductor wafer wherein said electronic devices have edges;
separation scribe lines bounding the edges of the electronic devices and separating the electronic devices from each other;
a conductive grid interconnecting a group of said electronic devices and having an external ion external to the electronic devices of said group and an internal portion internal to the electronic devices of said group, the external portion of said conductive grid extending along said separation scribe lines, and the internal portion extending within the electronic devices of said group;
interconnection pads positioned on the electronic devices of the group and coupling said external portion and said internal portion of said conductive grid being provided on the electronic devices of said group, said interconnection pads forming, along with said internal and external portions, power supply lines which are common to different electronic devices of said group; and
an external passivation layer positioned on the separation scribe lines and on the electronic devices of said group, wherein the interconnection pads include first and second interconnection pads, the separation scribe lines include a first separation scribe line positioned between the first and second interconnection pads, and the conductive grid includes a conductive first bridging connection electrically coupled between the first and second interconnection pads and extending on an external surface of a portion of the external passivation layer that is positioned on the first separation scribe line, wherein the external portion includes a fuse link.

14. A method comprising:
forming scribe lines on a semiconductor wafer;
forming a plurality of electronic devices integrated on said semiconductor wafer and separated from each other by said scribe lines, the electronic devices including first and second electronic devices;
forming an external passivation layer positioned on the scribe lines and on the electronic devices;
forming a respective plurality of interconnection pads on each electronic device respectively, wherein the interconnection pads include first and second interconnection pads on the first and second electronic devices, respectively, and the scribe lines include a first scribe line positioned between the first and second interconnection pads;
forming a conductive grid on said semiconductor wafer, said forming said conductive grid including:
forming an external portion of said conductive grid along said scribe lines;
forming an internal portion of said conductive grid within said electronic devices; and
connecting one of the interconnection pads of each electronic device to one of the interconnection pads of adjacent one of the electronic devices and to said conductive grid, forming power supply lines common to said electronic devices, wherein the connecting includes forming a conductive first bridging connection electrically coupled between the first and second interconnection pads and extending on an external surface of a portion of the external passivation layer that is positioned on the first scribe line; and
supplying a voltage to all of said electronic devices simultaneously said conductive grid.

15. The method of claim 14 wherein forming said internal portion comprises electrically connecting two interconnection pads of a same electronic device of the electronic devices.

16. The method of claim 14, comprising simultaneously testing said electronic devices.

17. A semiconductor wafer configured for wafer level testing, comprising:
a plurality of electronic devices integrated on the semiconductor wafer, each electronic device including a power supply pad;
scribe lines separating the electronic devices from each other;
a conductive grid of conductive lines extending lengthwise in the scribe lines, wherein the conductive grid of conductive lines includes first conductive lines extending substantially parallel to each other and second conductive lines extending substantially parallel to each other and substantially orthogonally to the first conductive lines;
a plurality of bridging connectors electrically connecting the conductive grid to the power supply pad of each of the electronic devices; and
an external passivation layer positioned on the scribe lines and on the electronic devices, wherein the electronic devices include first and second electronic devices, the scribe lines include a first scribe line positioned between the first and second electronic devices, the bridging connectors includes a first bridging connector electrically coupled between the power supply pad of the first electronic device and the power supply pad of the second electronic device, and the first bridging connector extends on an external surface of a portion of the external passivation layer that is positioned on the first scribe line.

18. The semiconductor wafer according to claim 17, wherein the first conductive lines are insulated from the second conductive lines at crossover points at which one of the first conductive lines crosses one of the second conductive lines.

19. The semiconductor wafer according to claim 17, further comprising:

an insulating layer extending within and at least partially filling said scribe lines, wherein the external passivation layer covers the insulating layer and the conductive lines are buried in said insulating layer, the bridging connectors extending on said insulating layer and on at least one of the devices; and a plurality of connection vias extending through the insulating layer and the external passivation layer and respectively connecting respective bridging connectors to respective conductive lines.

* * * * *

UNITED STATES PATENT AND TRADEMARK OFFICE
CERTIFICATE OF CORRECTION

PATENT NO.        : 8,378,346 B2
APPLICATION NO.   : 13/022419
DATED             : February 19, 2013
INVENTOR(S)       : Alberto Pagani Page 1 of 1

It is certified that error appears in the above-identified patent and that said Letters Patent is hereby corrected as shown below:

In the Claims

Column 11, Line 63:
"positioned on the first separation scribe line wherein said" should read, --positioned on the first separation scribe line, wherein said--.

Column 12, Line 25:
"conductive grid interconnecting a group of said electronic" should read, --a conductive grid interconnecting a group of said electronic--.

Column 15, Line 35:
"devices and having an external ion external to the" should read, --devices and having an external portion external to the--.

Column 16, Line 25:
"simultaneously said conductive grid" should read, --simultaneously through said conductive grid--.

Signed and Sealed this
Twenty-seventh Day of August, 2013

Teresa Stanek Rea
*Acting Director of the United States Patent and Trademark Office*